United States Patent
Hashimoto et al.

(10) Patent No.: US 10,840,402 B2
(45) Date of Patent: Nov. 17, 2020

(54) SOLAR CELL MODULE

(71) Applicant: Panasonic Intellectual Property Management Co., Ltd., Osaka (JP)

(72) Inventors: Haruhisa Hashimoto, Osaka (JP); Hiroshi Kanno, Osaka (JP); Akimichi Maekawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 330 days.

(21) Appl. No.: 15/697,955

(22) Filed: Sep. 7, 2017

(65) Prior Publication Data

US 2017/0373212 A1 Dec. 28, 2017

Related U.S. Application Data

(63) Continuation of application No. PCT/JP2016/000539, filed on Feb. 3, 2016.

(30) Foreign Application Priority Data

Mar. 11, 2015 (JP) ................................ 2015-048584

(51) Int. Cl.
*H01L 31/054* (2014.01)
*H02S 40/22* (2014.01)
*H01L 31/042* (2014.01)

(52) U.S. Cl.
CPC ........ *H01L 31/0547* (2014.12); *H01L 31/042* (2013.01); *H02S 40/22* (2014.12); *Y02E 10/52* (2013.01)

(58) Field of Classification Search
CPC ... H02S 40/22; H01L 31/0547; H01L 31/042; H01L 31/048
See application file for complete search history.

(56) References Cited

U.S. PATENT DOCUMENTS

| 2009/0283133 A1 | 11/2009 | Hebrink et al. |
| 2009/0283144 A1 | 11/2009 | Hebrink et al. |
| 2011/0297207 A1 | 12/2011 | Ishihara et al. |
| 2015/0059831 A1* | 3/2015 | Fukumochi ........... H01L 31/048 136/246 |
| 2015/0364616 A1 | 12/2015 | Tohoda |

FOREIGN PATENT DOCUMENTS

| JP | 2011-521289 A | 7/2011 | |
| JP | 2013-098496 A | 5/2013 | |
| WO | 2010/092693 A1 | 8/2010 | |
| WO | WO-2013168612 A1 * | 11/2013 | ........... H01L 31/048 |
| WO | 2014/132312 A1 | 9/2014 | |

OTHER PUBLICATIONS

International Search Report issued in Application No. PCT/JP2016/000539 dated Apr. 19, 2016, with English translation.

* cited by examiner

*Primary Examiner* — Matthew T Martin
(74) *Attorney, Agent, or Firm* — McDermott Will & Emery LLP (57) ABSTRACT

A solar cell module includes: a first solar cell; a second solar cell disposed apart from the first solar cell with a space therebetween; a first light reflector disposed on an edge portion of the first solar cell, and overlapping the space; and a second light reflector disposed on an edge portion of the second solar cell, and overlapping the space.

11 Claims, 11 Drawing Sheets

SOLAR CELL MODULE

CROSS REFERENCE TO RELATED APPLICATIONS

This application is a U.S. continuation application of PCT International Patent Application Number PCT/JP2016/000539 filed on Feb. 3, 2016, claiming the benefit of priority of Japanese Patent Application Number 2015-048584 filed on Mar. 11, 2015, the entire contents of which are hereby incorporated by reference.

BACKGROUND

1. Technical Field

The present disclosure relates to a solar cell module.

2. Description of the Related Art

In recent years, solar cell modules have been progressively developed as photoelectric conversion devices which convert light energy into electric energy. Solar cell modules can directly convert inexhaustible sunlight into electricity, and thus have less environmental impact and generate power more cleanly than power generation using fossil fuels. Accordingly, such solar cell modules are expected to provide new energy sources.

For example, a solar cell module has a structure in which solar cells are sealed by a filling member, between a front surface shield and a back surface shield. In the solar cell module, the solar cells are disposed in a matrix. Pairs of adjacent solar cells among solar cells linearly aligned in either the row direction or the column direction are connected by tab lines to form a string.

Conventionally, a solar cell module has been proposed in which in order to effectively use sunlight emitted on the space between solar cells, a light reflector projecting out from the light-receiving surfaces of the solar cells and inclined relative to the light-receiving surfaces is provided in the space between the solar cells (for example, Japanese Unexamined Patent Application Publication No. 2013-98496).

SUMMARY

However, a conventional solar cell module often has difficulty in appropriately disposing a light reflector in the space between two adjacent solar cells since, for instance, the width of the space between two adjacent solar cells partially varies. The effects of improvement in efficiency of power generation achieved by the use of the light reflector will be thus diminished.

The present disclosure provides a solar cell module which effectively improves efficiency of power generation, using light reflectors.

In order to provide such a solar cell module, a solar cell module according to an aspect of the present disclosure includes: a first solar cell; a second solar cell disposed apart from the first solar cell with a space therebetween; a first light reflector disposed on an edge portion of the first solar cell, and overlapping the space; and a second light reflector disposed on an edge portion of the second solar cell, and overlapping the space.

The light reflectors effectively improve efficiency of power generation.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

The following describes embodiments of the present disclosure with reference to the drawings. The embodiments described below each illustrate a particular example of the present disclosure. Thus, the numerical values, shapes, materials, elements, the arrangement and connection of the elements, processes, the order in which the processes are performed, and others indicated in the following embodiments are mere examples, and are not intended to limit the present disclosure. Therefore, among the elements in the following embodiments, elements not recited in any of the independent claims defining the most generic concept of the present disclosure are described as arbitrary elements.

The drawings are schematic diagrams and do not necessarily give strict illustration. Throughout the drawings, the same sign is given to the same element, and redundant description is omitted or simplified.

[Configuration of Solar Cell Module]

Figure 1:
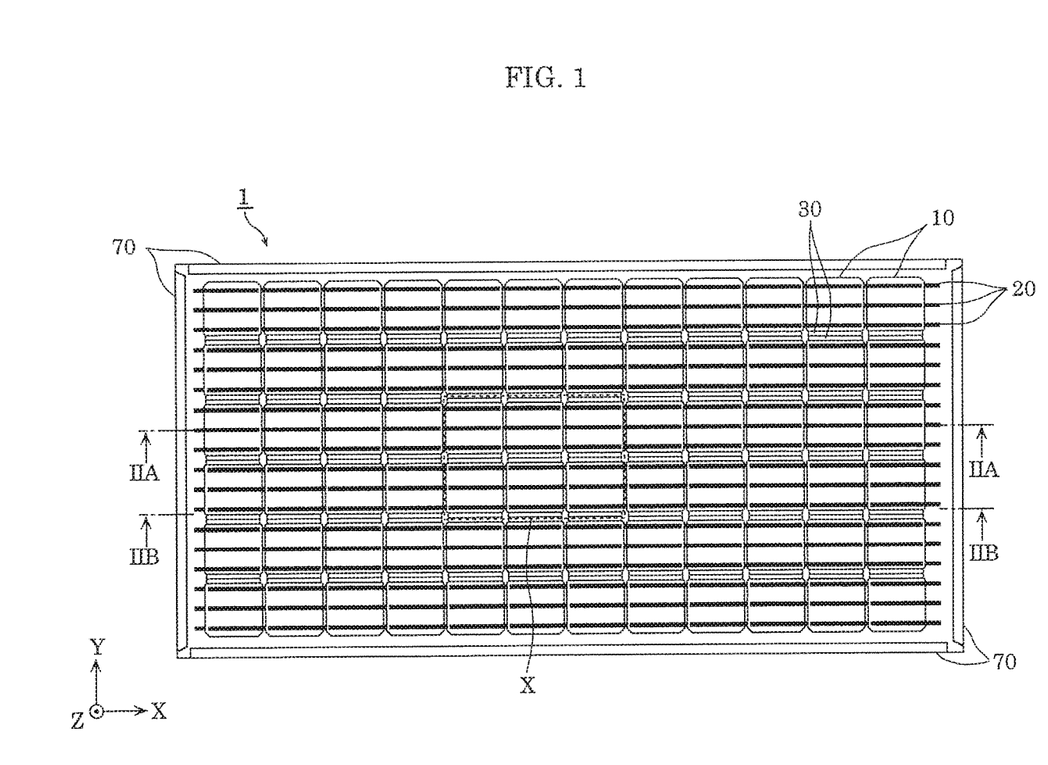
FIG. 1 is a plan view of a solar cell module according to an embodiment.
Figure 2A:
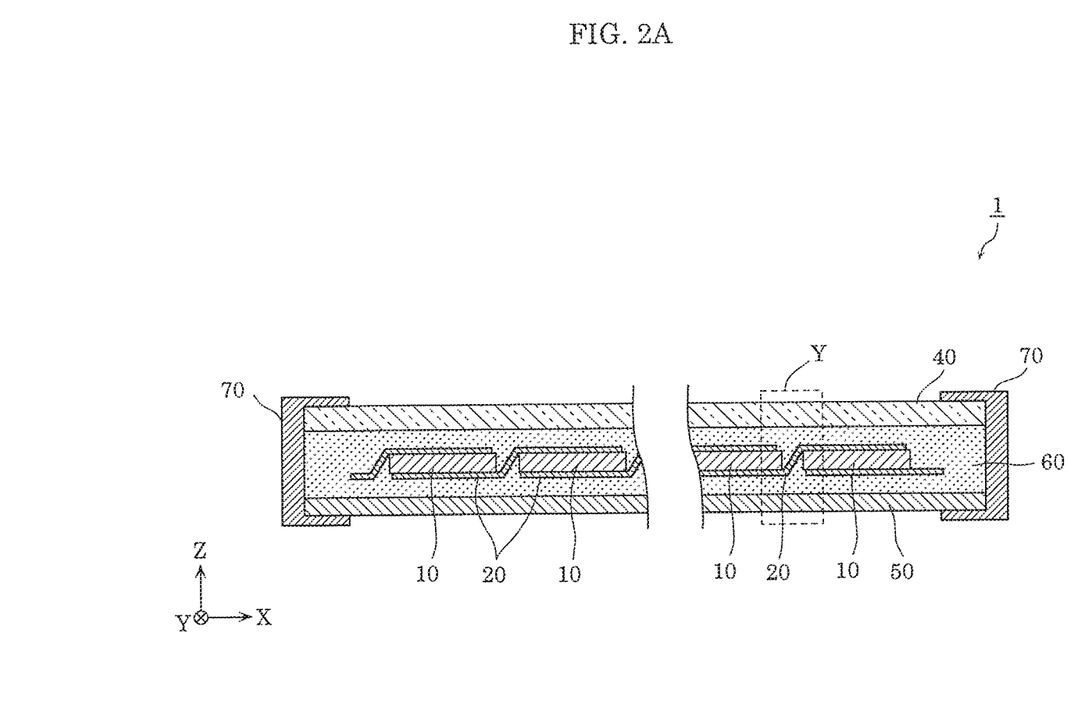
FIG. 2A is a cross-sectional view of the solar cell module according to the embodiment taken along line IIA-IIA in FIG. 1.
Figure 2B:
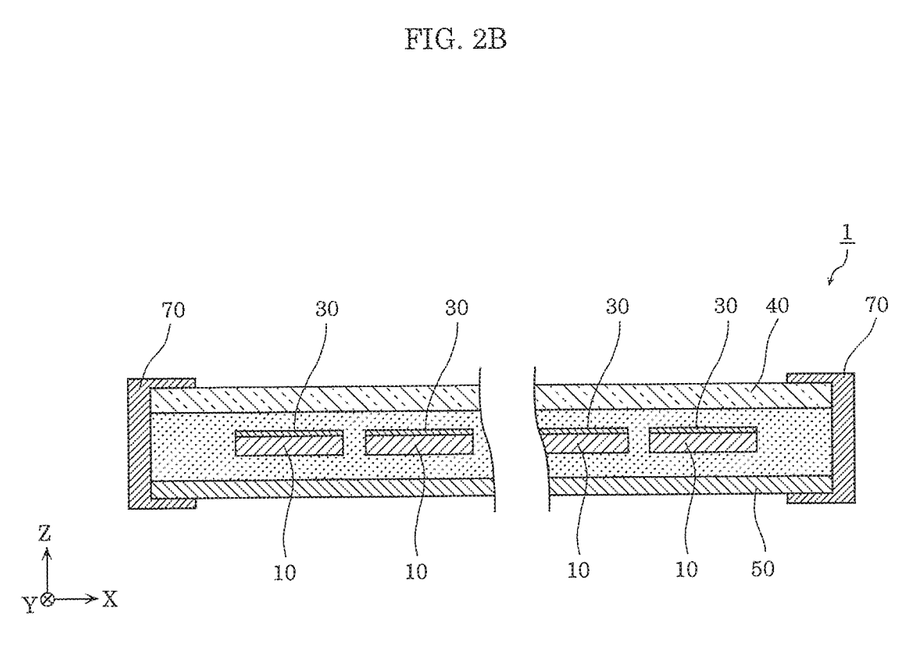
FIG. 2B is a cross-sectional view of the solar cell module according to the embodiment taken along line IIB-IIB in FIG. 1.

The first describes a schematic configuration of solar cell module 1 according to an embodiment, with reference to FIGS. 1, 2A, and 2B. FIG. 1 is a plan view of solar cell module 1 according to the embodiment. FIGS. 2A and 2B are cross-sectional views of solar cell module 1 according to the embodiment taken along line IIA-IIA and line IIB-IIB in FIG. 1.

Note that in FIGS. 1, 2A, and 2B, the Z axis is perpendicular to the principal surface of solar cell module 1, and the X axis and the Y axis are orthogonal to each other, and are both orthogonal to the Z axis. The same applies to the Z axis, the X axis, and the Y axis in the drawings described below.

As illustrated in FIGS. 1, 2A, and 2B, solar cell module 1 includes solar cells 10, tab lines 20, light reflectors 30, front surface shield 40, back surface shield 50, filling member 60, and frame 70. Solar cell module 1 has a structure in which solar cells 10 are sealed by filling member 60 between front surface shield 40 and back surface shield 50.

As illustrated in FIG. 1, the shape of solar cell module 1 in a plan view is substantially quadrilateral, for example. As an example, solar cell module 1 has a substantially quadrilateral shape having a width of about 1600 mm, and a length of about 800 mm. Note that the shape of solar cell module 1 is not limited to a quadrilateral.

Figure 3:
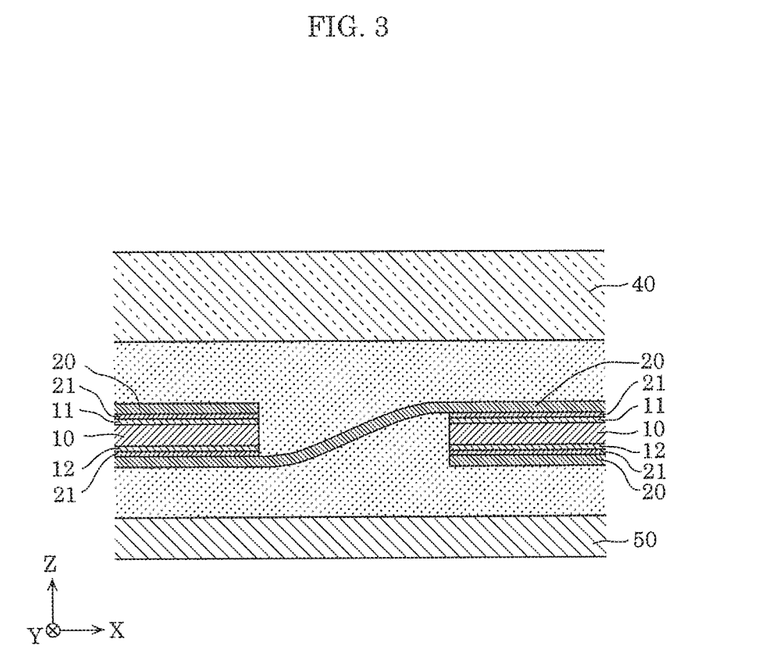
FIG. 3 is a partial enlarged cross sectional view of the solar cell module according to the embodiment, illustrating enlarged region Y surrounded by the dashed line in FIG. 2A.
Figure 4:
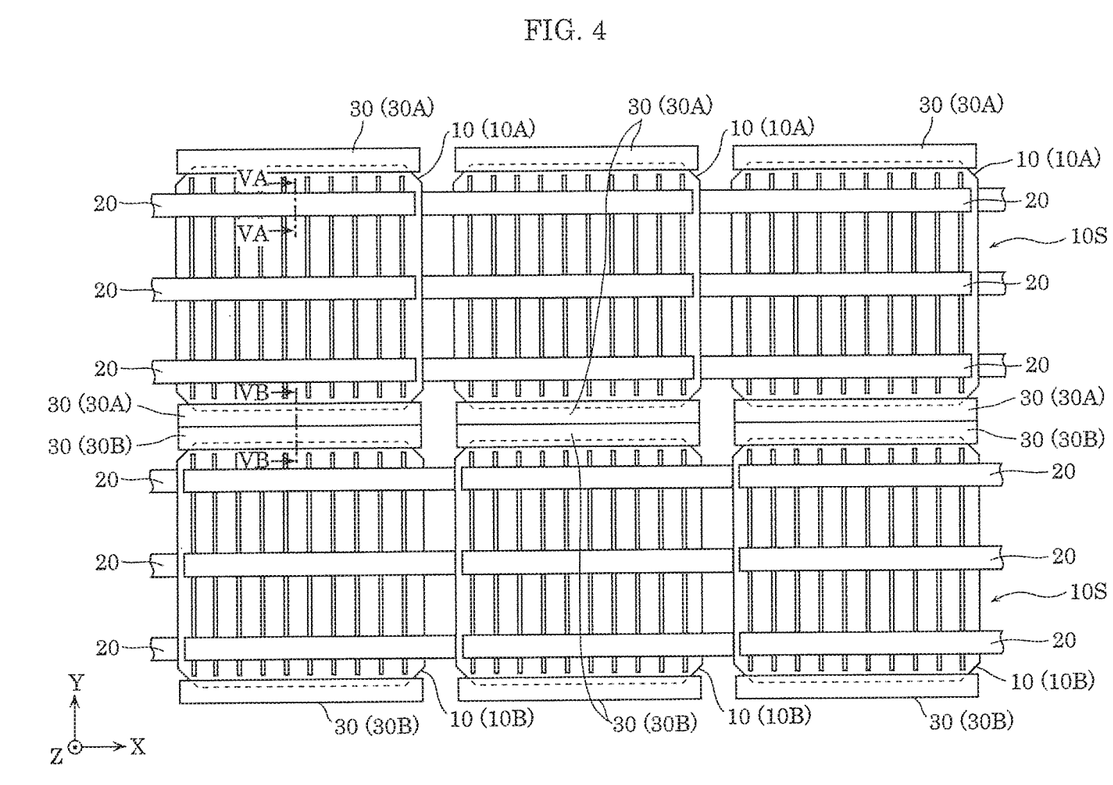
FIG. 4 is a partial enlarged plan view of the solar cell module according to the embodiment, illustrating enlarged region X surrounded by the dashed line in FIG. 1.
Figure 5A:
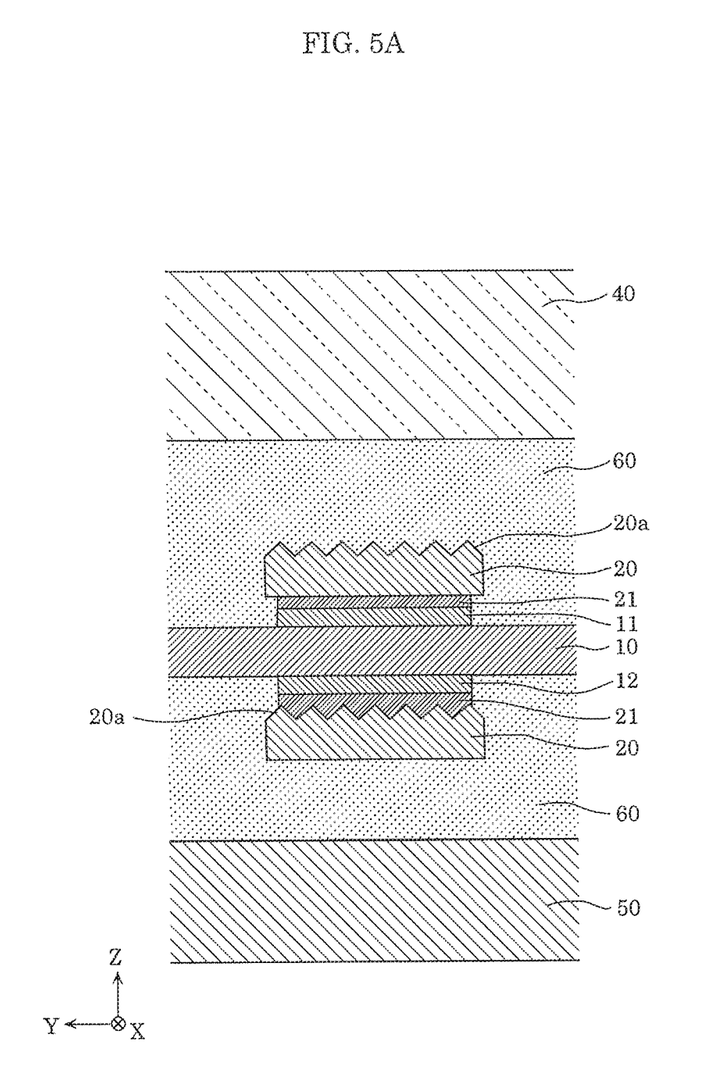
FIG. 5A is an enlarged cross sectional view of the solar cell module according to the embodiment taken along line VA-VA in FIG. 4.
Figure 5B:
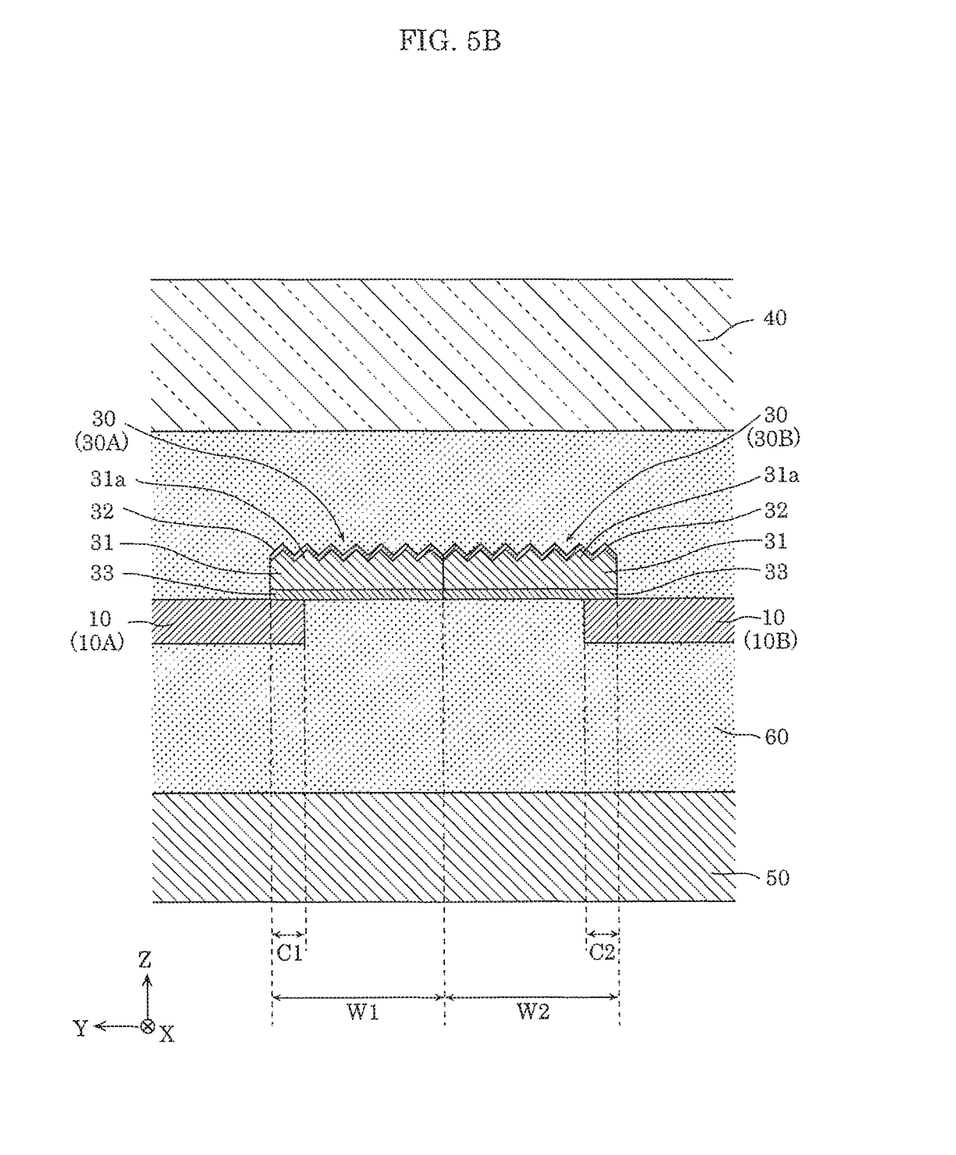
FIG. 5B is an enlarged cross sectional view of the solar cell module according to the embodiment taken along line VB-VB in FIG. 4.

The following describes in further detail components of solar cell module 1, with reference to FIGS. 3, 4, 5A, and 5B, and also FIGS. 1, 2A, and 2B. FIG. 3 is a partial enlarged cross sectional view of solar cell module 1 according to the embodiment, illustrating enlarged region Y surrounded by the dashed line in FIG. 2A. FIG. 4 is a partial enlarged plan view of solar cell module 1 according to the embodiment, illustrating enlarged region X surrounded by the dashed line in FIG. 1. FIGS. 5A and 5B are enlarged cross sectional views of solar cell module 1 according to the embodiment taken along line VA-VA and line VB-VB in FIG. 4, respectively. Note that FIG. 5A illustrates a structure around tab lines 20, and FIG. 5B illustrates a structure around light reflectors 30.

[Solar Cell (Photovoltaic Cell)]

Solar cell 10 is a photoelectric conversion element (photovoltaic element) which converts light such as sunlight into power. As illustrated in FIG. 1, solar cells 10 are disposed in rows and columns (a matrix) in the same plane.

Pairs of adjacent solar cells 10 among solar cells 10 linearly aligned in either the row direction or the column direction are connected by tab lines to form a string (cell string). Solar cells 10 are formed into a string by being electrically connected by tab lines 20. Solar cells 10 in one string 10S are connected in series by tab lines 20.

As illustrated in FIG. 1, in the present embodiment, 12 solar cells 10 disposed at equal intervals in the row direction (the X axis direction) are connected by tab lines 20 to form one string 10S. More specifically, each string 10S is constituted by sequentially connecting pairs of solar cells 10 adjacent in the row direction (the X axis direction) using three tab lines 20 for each pair, so that all solar cells 10 in a line aligned in the row direction are connected.

A plurality of strings 10S are formed. Strings 10S are arranged in the other of the row direction or the column direction in which solar cells 10 are aligned. Six strings 10S are formed in the present embodiment. As illustrated in FIG. 1, six strings 10S are disposed at equal intervals along the column direction (the Y axis direction), parallel to one another.

Note that leading solar cell 10 in each string 10S is connected to a connecting line (not illustrated) via tab lines 20. Furthermore, solar cell 10 at the tail end in each string 10S is connected to a connecting line (not illustrated) via tab lines 20. Accordingly, a plurality of strings 10S (six strings 10S in FIG. 1) are connected in series or parallel to one another to constitute a cell array. In the present embodiment, two adjacent strings 10S are connected in series to constitute a series connection (a series connection of 24 solar cells 10), and three such series connections are connected in parallel.

As illustrated in FIGS. 1 and 4, solar cells 10 are disposed such that solar cells adjacent in the row direction and the column direction have a space therebetween. As described below, light reflectors 30 are disposed in the space.

In the present embodiment, solar cell 10 has a substantially quadrilateral shape in a plan view. Specifically, solar cell 10 is a 125-mm square having chamfered corners. Thus, one string 10S is constituted such that sides of two adjacent solar cells 10 are facing each other. Note that the shape of solar cell 10 is not limited to a substantially quadrilateral shape.

The basic structure of solar cell 10 is a semiconductor pin junction, and as an example, solar cell 10 is constituted by an n-type monocrystalline silicon substrate which is an n-type semiconductor substrate, and an i-type amorphous silicon layer, an n-type amorphous silicon layer, and an n-side surface electrode which are sequentially formed on a principal surface side (front surface side) of the n-type monocrystalline silicon substrate, and an i-type amorphous silicon layer, a p-type amorphous silicon layer, and a p-side surface electrode which are sequentially formed on the other principal surface side (back surface side) of the n-type monocrystalline silicon substrate. The n-side surface electrode and the p-side surface electrode are transparent electrodes such as, for example, indium tin oxide (ITO) electrodes.

As illustrated in FIG. 3, front side collector electrode 11 (n-side collector electrode) electrically connected with the n-side surface electrode of solar cell 10, and back side collector electrode 12 (p-side collector electrode) electrically connected with the p-side surface electrode of solar cell 10 are formed on solar cell 10. Front side collector electrode 11 is formed in contact with, for example, the n-side surface electrode, and back side collector electrode 12 is formed in contact with, for example, the p-side surface electrode.

Front side collector electrode 11 and back side collector electrode 12 are each constituted by, for example, a plurality of finger electrodes formed linearly and orthogonally to the direction in which tab lines 20 extend, and a plurality of bus bar electrodes connected with the finger electrodes and formed linearly in the direction orthogonal to the finger electrodes (the direction in which tab lines 20 extend). The number of bus bar electrodes is the same as, for example, the number of tab lines 20, and is three in the present embodiment. Note that front side collector electrode 11 and back side collector electrode 12 have the same shape, but may have other shapes.

Front side collector electrode 11 and back side collector electrode 12 are made of a conductive material having low resistance, such as silver (Ag). For example, front side collector electrode 11 and back side collector electrode 12 can be formed by screen printing a conductive paste obtained by dispersing conductive filler such as silver in a binder resin, in a predetermined pattern on the n-side surface electrode and the p-side surface electrode.

In solar cell 10 having such a configuration, both the front surface (n-side surface) and the back surface (p-side surface) serve as light-receiving surfaces. For example, light can enter through both front surface shield 40 and back surface shield 50 by using light-transmitting members for both front surface shield 40 and back surface shield 50. The charge carriers generated in the photoelectric converter of solar cell 10 by the cell being irradiated with light are diffused to the n-side surface electrode and the p-side surface electrode as photoelectric currents, collected by front side collector electrode 11 and back side collector electrode 12, and flow to tab lines 20. The charge carriers generated in solar cell 10 can be efficiently taken out to an external circuit by providing front side collector electrode 11 and back side collector electrode 12 as described above.

[Tab Line]

As illustrated in FIGS. 1 and 2A, tab lines 20 (interconnectors) electrically connect pairs of adjacent solar cells 10 in string 10S. As illustrated in FIG. 4, in the present embodiment, each pair of adjacent solar cells 10 are connected by three tab lines 20 disposed substantially parallel to each other. Tab lines 20 extend in the alignment direction of the pair of solar cells 10 to be connected.

Tab lines 20 are conductive elongated lines, and are ribbon-shaped metallic foil, for example. Tab lines 20 can be produced by cutting, for example, metallic foil, such as copper foil or silver foil having surfaces entirely covered with solder, silver, or the like into strips having a predetermined length.

As illustrated in FIG. 3, an end portion of each tab line 20 is disposed on the front surface of one solar cell 10 among two adjacent solar cells 10, and another end portion of tab line 20 is disposed on the back surface of other solar cell 10 among two adjacent solar cells 10.

Each tab line 20 electrically connects the n-side collector electrode (collector electrode on the front surface side) of one of two adjacent solar cells 10, and the p-side collector electrode (collector electrode on the back surface side) of the other of two adjacent solar cells 10. Specifically, tab lines 20 are connected with the bus bar electrodes of front side collector electrode 11 of one solar cell 10 and the bus bar electrodes of back side collector electrode 12 of other solar cell 10. Tab lines 20 and front side collector electrode 11 (back side collector electrode 12) are bonded together by, for example, thermo compression bonding with conductive adhesive 21 therebetween.

For example, a conductive adhesive paste, a conductive adhesive film, or an anisotropically conductive film (ACF) can be used as conductive adhesive 21. A conductive adhesive paste is a pasty adhesive obtained by dispersing conductive particles in a thermosetting adhesive resin material such as an epoxy resin, an acrylic resin, or a urethane resin, for example. A conductive adhesive film and an anisotropically conductive film are obtained by dispersing conductive particles in a thermosetting adhesive resin material and forming the material into films.

Note that tab lines 20 and front side collector electrode 11 (back side collector electrode 12) may be joined using solder material, rather than conductive adhesive 21. A resin adhesive which does not contain conductive particles may be used, instead of conductive adhesive 21. In this case, by appropriately designing the thickness of an applied resin adhesive, a resin adhesive softens when pressure is applied for thermo compression bonding, and consequently the surface of front side collector electrode 11 and tab lines 20 are brought into direct contact and electrically connected.

The surfaces of tab lines 20 in the present embodiment have recesses and protrusions 20a as illustrated in FIG. 5A. When light which has entered solar cell module 1 falls on the surface of tab line 20, recesses and protrusions 20a scatter the light and cause the light to be reflected by the interface between front surface shield 40 and the air layer or the interface between front surface shield 40 and filling member 60 so that the reflected light is led to solar cell 10. Accordingly, the light reflected by the surface of tab line 20 also effectively contributes to power generation, and thus the efficiency of power generation of solar cell module 1 improves.

A line obtained by forming a silver vapor-deposited film on the surface of copper foil having recesses and protrusions 20a as the surface shape can be used as tab line 20 as described above. Note that the surface of tab line 20 may not have recesses and protrusions, but may rather be flat. A light reflector whose surface has recesses and protrusions may be separately stacked on a tab line having a flat surface.

[Light Reflector]

As illustrated in FIGS. 1 and 2B, one or more light reflectors 30 are disposed on solar cell 10. In the present embodiment, light reflectors 30 are disposed on solar cells 10. Specifically, as illustrated in FIG. 4, light reflectors 30 are disposed on first solar cell 10A and second solar cell 10B disposed with a space therebetween.

As illustrated in FIG. 4, light reflectors 30 are disposed in the space between two adjacent solar cells 10 (first solar cell 10A and second solar cell 10B). In the present embodiment, light reflectors 30 are disposed on two solar cells 10, overlapping the space between two adjacent solar cells 10. Specifically, as light reflectors 30, solar cell module 1 includes first light reflector 30A disposed on an edge portion of first solar cell 10A and overlapping the space between two adjacent solar cells 10, and second light reflector 30B disposed on an edge portion of second solar cell 10B and overlapping the space.

Specifically, light reflectors 30 (first light reflector 30A and second light reflector 30B) are disposed on edge portions of solar cells 10 so as to be partially overlapping the space between two adjacent strings 10S. In two adjacent strings 10S, first light reflector 30A disposed on first solar cell 10A in one string 10S and second light reflector 30B disposed on solar cell 10B in another string 10S face each other. Stated differently, first light reflector 30A extends toward second light reflector 30B, and second light reflector 30B extends toward first light reflector 30A.

In the present embodiment, two light reflectors 30 are disposed on each solar cell 10, except for solar cells 10 in outermost strings 10S. Light reflector 30 has a tape-like shape that extends along the length of string 10S (in the direction orthogonal to the alignment direction of first solar cell 10A and second solar cell 10B), an example of which is an elongated quadrilateral shape. Light reflector 30 is bonded to solar cell 10 along one side of solar cell 10 such that a lengthwise edge portion of light reflector 30 and an edge portion of solar cell 10 overlap. In a perimeter portion of solar cell 10, a power generation ineffectual region is present in which charge carriers cannot be efficiently generated even if light enters, due to manufacturing reasons. Light reflector 30 may be bonded onto the power generation ineffectual region of solar cell 10.

As illustrated in FIG. 4, in a plan view, two facing light reflectors 30 (first light reflector 30A and second light reflector 30B) disposed on two adjacent solar cells 10 (first solar cell 10A and second solar cell 10B) cover the space between two adjacent strings 10S. Specifically, in a plan view, the space between two adjacent strings 10S is covered with first light reflector 30A and second light reflector 30B facing each other.

Figure 6A:
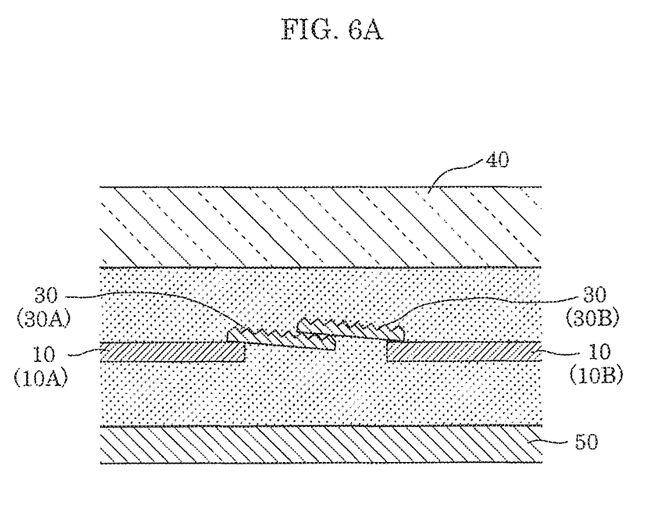
FIG. 6A is an enlarged cross sectional view illustrating another example of a structure around light reflectors of the solar cell module according to the embodiment.
Figure 6B:
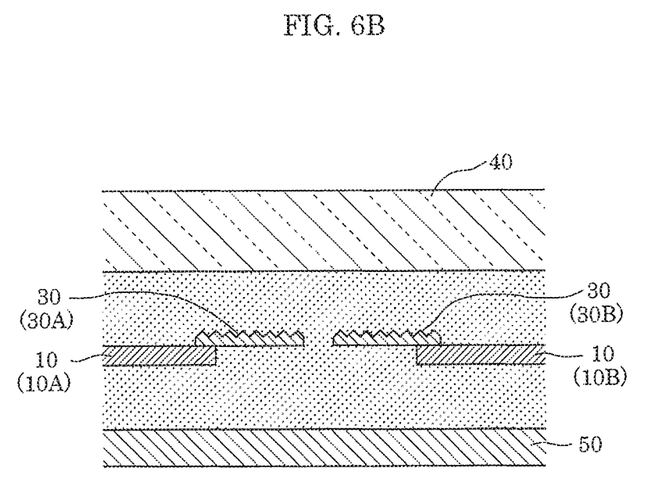
FIG. 6B is an enlarged cross sectional view illustrating yet another example of a structure around the light reflectors of the solar cell module according to the embodiment.

In the present embodiment, as illustrated in FIG. 5B, two facing light reflectors 30 (first light reflector 30A and second light reflector 30B) are disposed such that the lateral surfaces along the edges of light reflectors 30 are in contact, fully covering the space but not overlapping each other. Yet light reflectors 30 may be disposed in a different manner. For example, as illustrated in FIG. 6A, two light reflectors 30 (first light reflector 30A and second light reflector 30B) may partially overlap each other. Stated differently, edge portions of two facing light reflectors 30 extending from the solar cells may overlap in the Z axis direction. Alternatively, as illustrated in FIG. 6B, two facing light reflectors 30 (first light reflector 30A and second light reflector 30B) may have a space therebetween, and the space between two adjacent strings 10S may not be covered completely.

Note that two light reflectors 30 (first light reflector 30A and second light reflector 30B) disposed on two adjacent solar cells 10 (first solar cell 10A and second solar cell 10B) have the same shape. In the present embodiment, all light reflectors 30 included in solar cell module 1 have the same shape.

As illustrated in FIG. 5B, light reflectors 30 each include resin base 31 and reflective film 32 on the surface of resin base 31. Resin base 31 includes polyethylene terephthalate (PET) or acrylics, for example. Reflective film 32 is a film made of metal such as, for example, aluminum or silver, and is an aluminum evaporated film in the present embodiment.

Here, recesses and protrusions 31a are formed in the surface of resin base 31, and reflective film 32 is formed on the surface of recesses and protrusions 31a of resin base 31 by vapor deposition. In this manner, resin base 31 and reflective film 32 are laminated, thus forming light reflector 30 whose surface has recesses and protrusions. When light which has entered solar cell module 1 falls on the surface of light reflector 30, recesses and protrusions 31a scatter the light and cause the scattered light to be reflected by the interface between front surface shield 40 and an air layer or the interface between front surface shield 40 and filling member 60 so as to lead the reflected light to solar cell 10. This also allows light that falls on a region which is located in the space between two adjacent solar cells 10 and is an ineffectual region (which is in the space between two adjacent strings 10S, and cannot cause incident light to contribute to power generation in the present embodiment) to contribute to power generation effectively, whereby efficiency of power generation of solar cell module 1 improves.

As described above, light reflector 30 has an elongated quadrilateral shape whose length is 100 mm to 130 mm, width is 1 mm to 20 mm, and thickness is 0.05 mm to 0.5 mm, for example. In the present embodiment, light reflector 30 has a length of 125 mm, a width of 5 mm, and a thickness of 0.1 mm.

The thickness of resin base 31 is 50 μm to 500 μm, for example. With regard to recesses and protrusions 31a, for example, a height between the peak and the bottom is at least 5 μm and at most 100 μm, and the spacing (intervals) between adjacent protruding portions is at least 20 μm and at most 400 μm. In the present embodiment, a height between the peak and the bottom is 12 μm, and the spacing (intervals) between adjacent protruding portions is 40 μm.

Note that in the present embodiment, recesses and protrusions 31a are achieved by triangular grooves that extend along the lengths of light reflectors 30, but the shapes are not limited to triangular grooves. Recesses and protrusions 31a may be achieved by cones, quadrangular pyramids, polygonal pyramids, or combinations of such shapes, as long as recesses and protrusions 31a scatter light.

Light reflector 30 is disposed on solar cell 10 using resin adhesive 33 that bonds the back surface of resin base 31 to solar cell 10. For example, light reflector 30 and solar cell 10 are thermo-compression bonded with resin adhesive 33 therebetween so as to be bonded together. Resin adhesive 33 is, for example, ethylene-vinyl acetate (EVA), and may be disposed on the back surface of resin base 31 in advance. Thus, light reflector 30 may be achieved by resin base 31, reflective film 32, and resin adhesive 33.

[Front Surface Shield, Back Surface Shield]

Front surface shield 40 (first shield) is a member which protects the front surface of solar cell module 1, and protects the inside of solar cell module 1 (such as solar cell 10) from the outside environment such as rainstorm and an external shock. As illustrated in FIGS. 2A and 2B, front surface shield 40 is disposed on the front surface side (n side) of solar cell 10, and protects the light-receiving surface on the front side of solar cell 10.

Front surface shield 40 is disposed on the light-receiving surface side of solar cell 10, and thus is achieved by a light-transmitting member which transmits light in a wavelength range used for photoelectric conversion in solar cell 10. Front surface shield 40 is, for example, a glass substrate (clear glass substrate) made of clear glass material or a resin substrate made of a hard resin material having a film-like or plate-like shape and light-transmitting and waterproof properties.

On the other hand, back surface shield 50 (second shield) is a member which protects the back surface of solar cell module 1, and protects the inside of solar cell module 1 from the outside environment. As illustrated in FIGS. 2A and 2B, back surface shield 50 is disposed on the back surface side (p side) of solar cell 10.

In the present embodiment, the back surface of solar cell 10 also serves as a light-receiving surface. Thus, back surface shield 50 protects the light-receiving surface on the back side of solar cell 10, and is achieved by a light-transmitting member. Back surface shield 50 is a film-like or plate-like resin sheet made of a resin material such as polyethylene terephthalate (PET) or polyethylene naphthalate (PEN), for example. Note that a glass sheet or glass substrate made of a glass material may be used as back surface shield 50.

Note that when no light enters from the back surface side of solar cell 10, back surface shield 50 may be a non-light-transmitting board or film. In this case, a non-light-transmitting member (light blocking member) such as, for example, a black member or a laminated film such as a resin film which includes metallic foil such as aluminum foil may be used as back surface shield 50.

The space between front surface shield 40 and back surface shields 50 is filled with filling member 60. Front surface shield 40 and back surface shield 50 are bonded and fixed to solar cell 10 by filling member 60.

[Filling Member]

Filling member (filler) 60 is located between front surface shield 40 and back surface shield 50. In the present embodiment, filling member 60 fills up the space between front surface shield 40 and back surface shield 50.

Filling member 60 is made of a light-transmitting resin material such as ethylene vinyl acetate (EVA). Filling member 60 includes a front-surface side filling member and a back-surface side filling member between which solar cells 10 are sandwiched. For example, filling member 60 includes two resin sheets (EVA sheets) between which six strings 10S are sandwiched and which are subjected to lamination processing (laminated).

[Frame]

Frame 70 is an outer frame which covers the perimeter edge portions of solar cell module 1. Frame 70 in the present embodiment is an aluminum frame. As illustrated in FIG. 1, frame 70 includes four portions fitted on the four sides of solar cell module 1. Frame 70 is bonded to the sides of solar cell module 1 with an adhesive, for example.

Note that solar cell module 1 includes a terminal box for taking out power generated by solar cells 10, which is not illustrated. The terminal box is fixed to back surface shield 50, for example. The terminal box includes a plurality of circuit components mounted on a circuit board.

Advantageous Effects and Others

The following describes advantageous effects of solar cell module 1 according to the present embodiment, also mentioning the circumstances which have led to the present disclosure.

Light which has fallen on the space between two adjacent solar cells had not contributed to power generation. Stated differently, the space between two adjacent solar cells was an ineffectual region which does not contribute to power generation.

In view of this, the inventors of the present application have conceived of disposing a light reflector in the space between two adjacent solar cells, and reflecting light which falls on this space using the light reflector so as to lead the incident light to a solar cell, thus causing the light which falls on the space to contribute to power generation. The inventors have conceived of, for example, bonding a light reflector such that the light reflector extends across a space between two adjacent solar cells.

However, when a plurality of solar cells are connected by tab lines into a string, the straightness of the string may be deviated by about several millimeters. In other words, the inventors found that the width of the space between two adjacent strings was partially different.

This is assumed to be influenced by manufacturing variations in the process of connecting a plurality of solar cells by tab lines to form a string (string formation process). For example, such variations are conceivably caused when disposing solar cells. Furthermore, distortion of the shape of a tab line also conceivably gives an influence. Specifically, tab lines are produced by pulling out narrow metallic foil wound around a bobbin and cutting the foil into strips. The wound foil consequently has a persistent winding shape, which results in distorted shapes of the tab lines.

As a result, the straightness of a string may be deviated in the string formation process, and the width of the space between two adjacent strings may be partially different.

Figure 7:
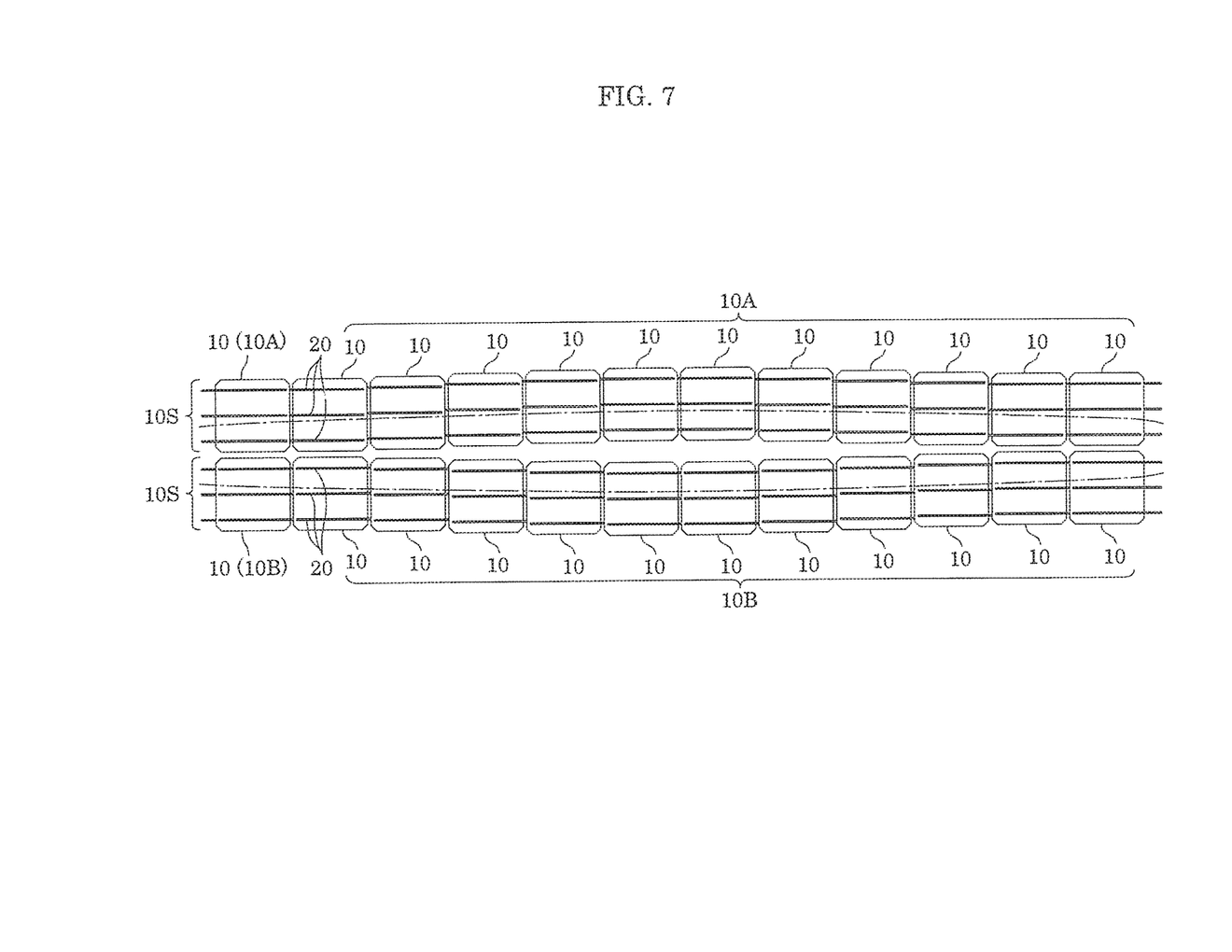
FIG. 7 is an illustration of deviation of straightness of strings in the solar cell module.

In particular, if a string is formed using tab lines having a persistent winding shape, the string will be warped and curved gently in a plan view. In this case, as illustrated in FIG. 7, if two curved strings 10S are disposed such that the curves are in opposite orientations in order to connect strings 10S in series, the width of the space between two strings 10S is greater in the central portion and smaller in both of the end portions.

For example, a variation in locations of solar cells 10 in the string formation process is about 1.5 mm. In addition, the amount of curvature of one string 10S (deviation from a reference straight line in an end portion of the string) may be about 2 mm.

As described above, with regard to solar cells 10 of the solar cell module, the width of the space between two adjacent solar cells 10 (first solar cell 10A and second solar cell 10B) may be partially different. In particular, the width of the space between two adjacent strings 10S may be partially different, and may be about 5 mm at the maximum.

In this case, if quadrilateral light reflectors are used for the space between two adjacent strings 10S such that a single light reflector is disposed across each pair of adjacent solar cells 10, a problem occurs that the light reflector cannot be appropriately disposed in the space between two adjacent solar cells 10.

For example, if there is a portion (the central portion in FIG. 7) where the width of the space between two strings 10S is greater than the length (width) of a light reflector in the transverse direction, the space between two strings 10S in such a portion cannot be covered with the light reflector. In addition, if there is a portion (both of the end portions in FIG. 7) where the width of the space between two strings 10S is smaller than the length (width) of a light reflector in the transverse direction, there is a possibility that the light reflector may cover the effectual region (power generating region) of solar cell 10.

In view of this, the inventors of the present application have come up with an idea of, when disposing light reflectors in the space between pairs of adjacent solar cells 10, disposing a light reflector on each of two adjacent solar cells 10 for the space between two adjacent solar cells 10, rather than bonding a single light reflector across two adjacent solar cells 10. In other words, the inventors have come up with an idea of disposing two light reflectors for the space between each pair of adjacent solar cells 10.

Specifically, as illustrated in FIGS. 4 and 5B, first light reflector 30A is disposed on an edge portion of first solar cell 10A and overlaps the space between first solar cell 10A and second solar cell 10B adjacent to each other, and second light reflector 30B is disposed on an edge portion of second solar cell 10B and overlaps the space.

Accordingly, even if the width of the space between two adjacent strings 10S is partially different, first light reflector 30A and second light reflector 30B can be disposed appropriately for the space between two adjacent solar cells 10. Specifically, first light reflector 30A and second light reflector 30B can cover the space between two adjacent solar cells 10 as much as possible, even if the width of the space is great or narrow.

Specifically, first light reflector 30A and second light reflector 30B can cover the space between two adjacent solar cells 10 as much as possible when the width of the space is great, as illustrated in FIGS. 5B and 6B. Accordingly, for example, if the straightness of string 10S deviates and thus the width of the space between two strings 10S is partially great (central portion in FIG. 7), first light reflector 30A and second light reflector 30B can cover such a space as much as possible.

On the other hand, at a portion where the width of the space between two adjacent solar cells 10 is narrow, first light reflector 30A and second light reflector 30B can completely cover such a space between two solar cells 10, as illustrated in FIGS. 5B and 6A. Accordingly, for example, when the straightness of string 10S deviates, even if the width of the space between two adjacent strings 10S is partially narrow (both of the end portions in FIG. 7), first light reflector 30A and second light reflector 30B can completely cover such a space.

As described above, in the present embodiment, two light reflectors 30 overlap the space between two adjacent solar cells 10 so as to eliminate the effects of variations in width of the space between adjacent strings 10S.

As described above, in solar cell module 1 according to the present embodiment, first light reflector 30A and second light reflector 30B are disposed, overlapping the space between first solar cell 10A and second solar cell 10B adjacent to each other. Accordingly, the space between first solar cell 10A and second solar cell 10B adjacent to each other can be covered as much as possible so as to eliminate the space. Specifically, first light reflector 30A and second light reflector 30B can be disposed appropriately for the space between first solar cell 10A and second solar cell 10B adjacent to each other.

Accordingly, first light reflector 30A and second light reflector 30B can reflect, as much as possible, light which has fallen on the space (ineffectual region) between first solar cell 10A and second solar cell 10B adjacent to each other so as to lead the reflected light to solar cells 10, whereby the efficiency of power generation of solar cell module 1 can be improved effectively.

For example, when light reflectors 30 are not disposed for the space between first solar cell 10A and second solar cell 10B adjacent to each other, light which has fallen on the space (ineffectual region) is reflected by the filling member on the back surface side (whose light utilization is about 40%), and enters solar cell module 10. In contrast, when light reflectors 30 are disposed for the space between first solar cell 10A and second solar cell 10B adjacent to each other, light reflector 30 has light utilization of about 80%, and thus light utilization is about double the light utilization when light reflectors 30 are not disposed, whereby the efficiency of power generation of solar cell module 1 can be improved effectively.

Furthermore, in the present embodiment, light reflectors 30 are disposed on edge portions of solar cells 10, rather than, for example, on back surface shield 50. Stated differently, first light reflector 30A is disposed on an edge portion of first solar cell 10A, and second light reflector 30B is disposed on an edge portion of second solar cell 10B.

As described above, disposing light reflectors 30 on power generation ineffectual regions in edge portions of solar cells 10 improves productivity, and also efficiently utilizes the capacity of solar cells 10 to generate power.

In the present embodiment, first light reflector 30A extends toward second light reflector 30B, and second light reflector 30B extends toward first light reflector 30A.

Accordingly, first light reflector 30A and second light reflector 30B face each other, and thus readily cover the space between first solar cell 10A and second solar cell 10B adjacent to each other.

In the present embodiment, the space between two adjacent solar cells 10 (first solar cell 10A and second solar cell 10B) is included in the space between two adjacent strings 10S, and light reflectors 30 are disposed, overlapping this space.

Accordingly, even if the straightness of string 10S deviates and the width of the space between two strings 10S is partially different, the space between two strings 10S can be readily covered along the entire lengths of strings 10S, by disposing light reflectors 30 on solar cells 10. Specifically, the effects of variations in width of the space between two strings 10S can be eliminated by pairs of light reflectors 30 which overlap the space.

The space between two adjacent strings 10S may be partially wide. In this case, the space between first solar cell 10A and second solar cell 10B may not be completely covered with two light reflectors 30, as illustrated in FIG. 6B.

In this case, the width of the space between solar cell 10 (first solar cell 10A) in one of two adjacent strings 10S and solar cell 10 (second solar cell 10B) in the other of two adjacent strings 10S, and the lengths of light reflectors 30 in the alignment direction of first solar cell 10A and second solar cell 10B may be determined to satisfy certain conditions.

Specifically, as illustrated in FIG. 5B, light reflectors 30 may be achieved such that a relation of $W1+W2 \geq Gmax+C1+C2$ is satisfied, where W1 denotes a width of first light reflector 30A in an alignment direction (Y axis direction) of first solar cell 10A and second solar cell 10B, W2 denotes a width of second light reflector 30B in the alignment direction, C1 denotes a width in the alignment direction of the edge portion of first solar cell 10A on which first light reflector 30A is disposed (a portion where first light reflector 30A is bonded to first solar cell 10A), C2 denotes a width in the alignment direction of the edge portion of second solar cell 10B on which second light reflector 30B is disposed (a portion where second light reflector 30B is bonded to second solar cell 10B), and Gmax denotes a maximum width of the space between two adjacent strings 10S.

Accordingly, even if the width of the space between two adjacent strings 10S varies, the space between two adjacent strings 10S can be completely covered with pairs of light reflectors 30 along the entire lengths of strings 10S.

Figure 8:
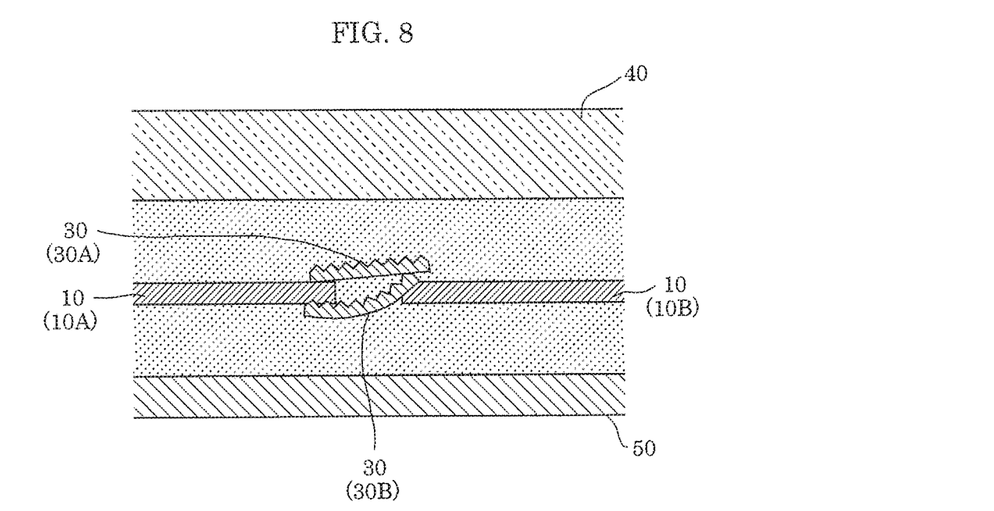
FIG. 8 is an illustration of a state where one of the two light reflectors of the solar cell module rides on a solar cell on which the other of the two light reflectors is disposed.

If the width of light reflector 30 in the alignment direction of first solar cell 10A and second solar cell 10B (in other words, the width in the direction in which light reflector 30 is projecting out) is excessively wide relative to the width of the space between two adjacent strings 10S (space between first solar cell 10A and second solar cell 10B adjacent to each other), one of two light reflectors 30 facing each other may ride on solar cell 10 on which the other of two light reflectors 30 is disposed. For example, as illustrated in FIG. 8, first light reflector 30A may ride on second solar cell 10B, or second light reflector 30B may ride on first solar cell 10A. In this case, light reflector 30 covers the power generating region (effectual region) of solar cell 10, which rather decreases efficiency of power generation.

In view of this, light reflection members 30 may be achieved such that W1, W2, C1 and C2 in FIG. 5B and Gmin satisfy a relation of $W1 \leq Gmin+C1$ and $W2 \leq Gmin+C2$, where Gmin denotes a minimum width of the space between two adjacent strings 10S (the space between the first string and the second string).

Accordingly, even if the space between two adjacent strings 10S is partially narrow, a state as illustrated in FIG. 8, or specifically, a state in which one of two light reflectors 30 facing each other rides on solar cell 10 on which the other of two light reflectors 30 is disposed can be avoided. Thus, efficiency of power generation can be much more effectively improved using light reflectors 30.

In the present embodiment, light reflector 30 having a tape-like shape that extends along the length of string 10S is bonded to an edge portion of solar cell 10 such that a lengthwise edge portion of light reflector 30 overlaps the edge portion of solar cell 10. Specifically, a lengthwise edge portion of first light reflector 30A is bonded to first solar cell 10A, and a lengthwise edge portion of second light reflector 30B is bonded to second solar cell 10B.

Accordingly, light reflector 30 can be disposed along the length of string 10S in the space (ineffectual region) between two adjacent strings 10S. Accordingly, the space between two adjacent strings 10S can be covered in a wide range, and thus light which falls on this space can be reflected by light reflector 30, and led to solar cell 10. As a result, efficiency of power generation of solar cell module 1 can be further improved.

In the present embodiment, string 10S is constituted such that sides of substantially quadrilateral solar cells are facing, and light reflectors 30 are bonded on sides other than the facing sides of two adjacent solar cells 10 in string 10S. Specifically, light reflector 30 is bonded on a side of solar cell 10 which defines the space between two adjacent strings 10S.

Accordingly, the space can be covered with light reflectors 30 while the space between two adjacent strings 10S is reduced and the ineffectual region is decreased. Therefore, the efficiency of power generation as the entire solar cell module can be improved.

Variations and Others

The above completes description of solar cell module 1 according to the present disclosure based on the embodiment, yet the present disclosure is not limited to the above embodiment.

Figure 9A:
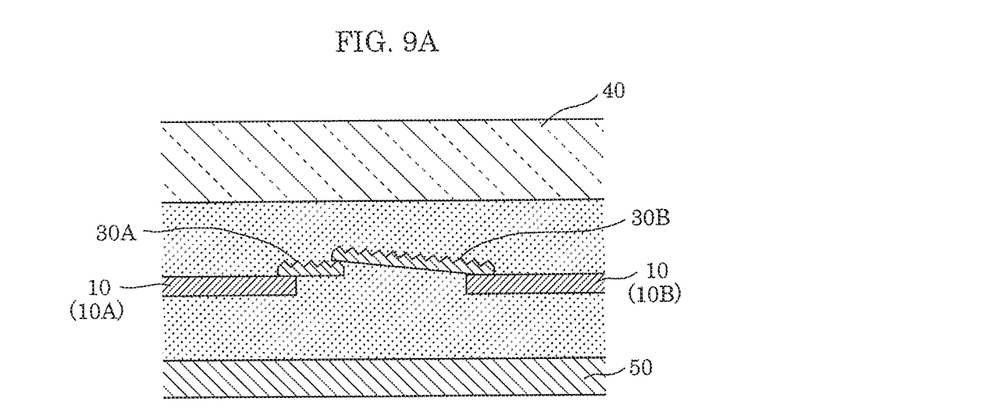
FIG. 9A is an enlarged cross sectional view illustrating a structure around light reflectors of a solar cell module according to Variation 1 of the embodiment.
Figure 9B:
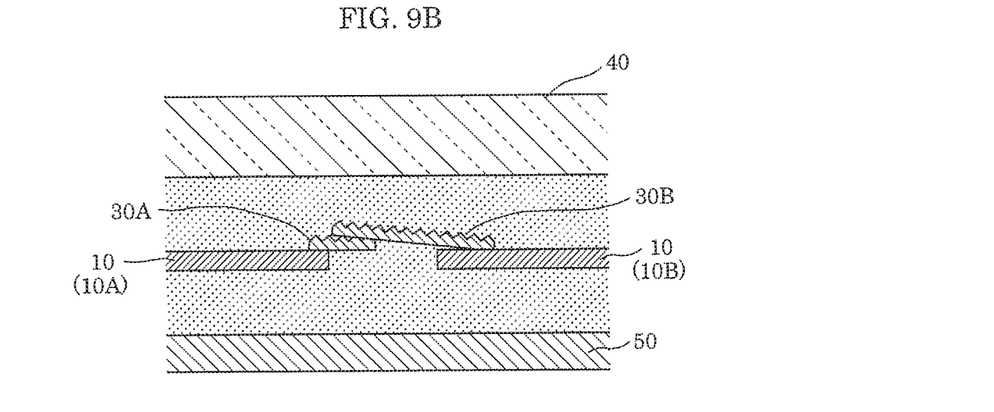
FIG. 9B is an enlarged cross sectional view illustrating a structure around the light reflectors of the solar cell module according to Variation 1 of the embodiment when the space between solar cells is narrow.

For example, in the above embodiment, as illustrated in FIG. 5B, two light reflectors 30 (first light reflector 30A and second light reflector 30B) which are facing each other have the same length (width) in the alignment direction of first solar cell 10A and second solar cell 10B, yet the present disclosure is not limited to this. For example, as illustrated in FIG. 9A, the length (width) of first light reflector 30A in the above alignment direction and the length (width) of second light reflector 30B in the above alignment direction may be different. Note that in FIG. 9A, the width of second light reflector 30B is greater than the width of first light reflector 30A. Accordingly, as illustrated in FIG. 9B, even if the space between two adjacent strings 10S (space between first solar cell 10A and second solar cell 10B) is partially narrow, one of two light reflectors 30 facing each other is prevented from riding on solar cell 10 on which the other of two light reflectors 30 is disposed. Therefore, the efficiency of power generation can be improved further effectively using light reflectors 30.

Figure 10A:
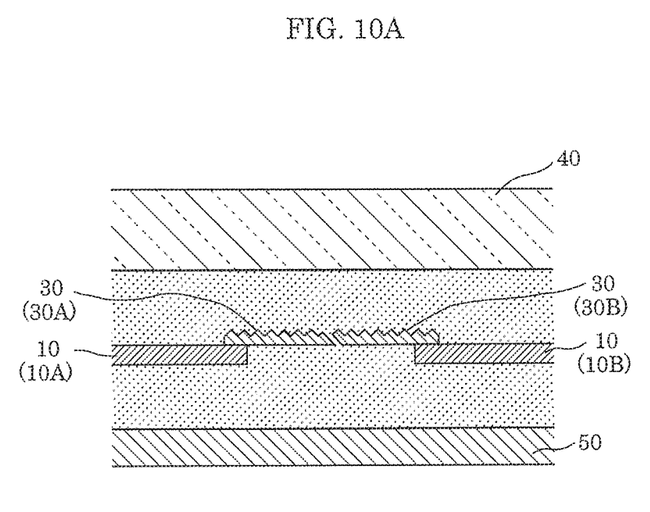
FIG. 10A is an enlarged cross sectional view illustrating a structure around light reflectors of a solar cell module according to Variation 2 of the embodiment.

In the above embodiment, the lateral surfaces along the edges of two light reflectors 30 facing each other are vertical profiles, yet the present disclosure is not limited to this. For example, the lateral surfaces along the edges of two light reflectors 30 facing each other may have inclined profiles. Specifically, as illustrated in FIG. 10A, the lateral surface along the edge of first light reflector 30A on the second light reflector 30B side and the lateral surface along the edge of second light reflector 30B on the first light reflector 30A side may have inclined profiles. In this case, as illustrated in FIG. 10A, in a plan view, the inclined surfaces of first light reflector 30A and second light reflector 30B may be facing each other such that the space between first light reflector 30A and second light reflector 30B cannot be viewed. Accordingly, even if first light reflector 30A and second light reflector 30B have a space therebetween, the space between first solar cell 10A and second solar cell 10B can be substantially completely eliminated, and thus the efficiency of power generation can be improved effectively.

Figure 10B:
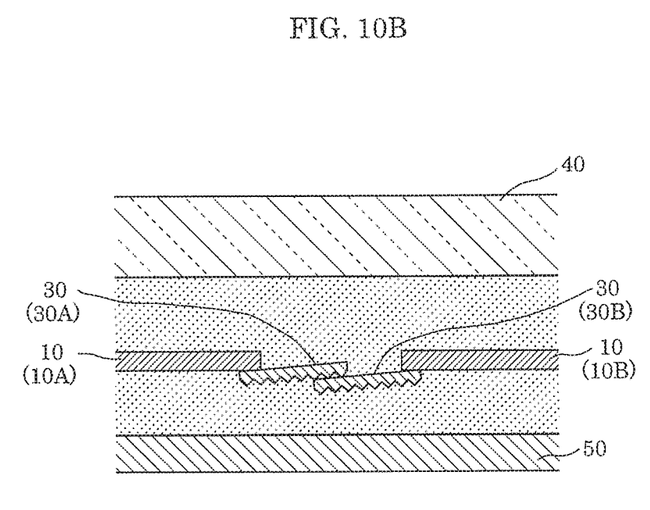
FIG. 10B is an enlarged cross sectional view illustrating a structure around light reflectors of a solar cell module according to Variation 3 of the embodiment.

In the above embodiment, light reflectors 30 are disposed on the front surface shield 40 side of solar cells 10, yet the present disclosure is not limited to this. For example, as illustrated in FIG. 10B, light reflectors 30 may be disposed on the back surface shield 50 side of solar cells 10. In other words, light reflectors 30 may be disposed on the surfaces opposite the light entering surfaces.

In the above embodiment, two light reflectors 30 are disposed on each solar cell 10 except for solar cells 10 in outermost string 10S, yet the present disclosure is not limited to this. For example, two light reflectors 30 may be disposed on each of all solar cells 10, or string 10S not located outermost may include solar cell 10 on which no light reflectors 30 are disposed. The number of light reflectors 30 disposed on each solar cell 10 may be one or three or more, rather than two. For example, light reflectors 30 may be disposed on the four sides of solar cell 10, or a plurality of light reflectors 30 may be disposed on each side.

In the above embodiment, light reflectors 30 are disposed in the space between two adjacent strings 10S, yet the present disclosure is not limited to this. For example, light reflectors 30 may be disposed in the space between two solar cells 10 adjacent in string 10S.

In the above embodiment, the semiconductor substrate of solar cell 10 is an n-type semiconductor substrate, but may be a p-type semiconductor substrate.

In the above embodiment, solar cell module 1 is a bifacial module which includes front surface shield 40 and back surface shield 50 both serving as light-receiving surfaces, yet the present disclosure is not limited to this. For example, solar cell module 1 may be a monofacial module which includes front surface shield 40 and back surface shield 50 only one of which (for example, front surface shield 40) serves as a light-receiving surface. If solar cell module 1 is a monofacial module, the p-side surface electrode is not necessarily transparent, and may be a reflective metal electrode, for example.

In the above embodiment, a semi-conducting material of a photoelectric converter of solar cell 10 is silicon, yet the present disclosure is not limited to this. Gallium arsenide (GaAs) or indium phosphide (InP) may be used as the semi-conducting material of the photoelectric converter of solar cell 10.

The present disclosure may also include embodiments as a result of various modifications that may be conceived by those skilled in the art, and embodiments obtained by combining elements and functions in the embodiments in any manner without departing from the spirit of the present disclosure.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A solar cell module, comprising:
   a first solar cell;
   a second solar cell disposed apart from the first solar cell with a space therebetween;
   a first light reflector disposed on an edge portion of the first solar cell, and overlapping the space;
   a second light reflector disposed on an edge portion of the second solar cell, and overlapping the space, and,
   a front surface shield and a back surface shield which protect the first solar cell and the second solar cell, wherein a portion of the first light reflector extending from the first solar cell and a portion of the second light reflector extending from the second solar cell partially overlap one another when viewed in plan, and the first light reflector and the second light reflector are disposed between the front surface shield and the back surface shield.

2. The solar cell module according to claim 1, wherein the first light reflector extends toward the second light reflector, and the second light reflector extends toward the first light reflector.

3. The solar cell module according to claim 1, wherein the space is covered with the first light reflector and the second light reflector in a plan view.

4. The solar cell module according to claim 1, wherein the first light reflector and the second light reflector have a space therebetween.

5. The solar cell module according to claim 1, wherein the first solar cell comprises a plurality of first solar cells, the second solar cell comprises a plurality of second solar cells, the plurality of first solar cells are connected by at least one tab line to form a first string, the plurality of second solar cells are connected by at least one tab line to form a second string, and the space between each of the plurality of first solar cells and each of the plurality of second solar cells is included in a space between the first string and the second string.

6. The solar cell module according to claim 5, wherein the first light reflector comprises a plurality of first light reflectors, the second light reflector comprises a plurality of second light reflectors, the plurality of first light reflectors are disposed on the plurality of first solar cells, and the plurality of second light reflectors are disposed on the plurality of second solar cells.

7. The solar cell module according to claim 5, wherein a relation of $W1+W2 \geq Gmax+C1+C2$ is satisfied for each of the plurality of first solar cells and each of the plurality of second solar cells, where W1 denotes a width of the first light reflector in an alignment direction of the first solar cell and the second solar cell, W2 denotes a width of the second light reflector in the alignment direction, C1 denotes a width in the alignment direction of the edge portion of the first solar cell on which the first light reflector is disposed, C2 denotes a width in the alignment direction of the edge portion of the second solar cell on which the second light reflector is disposed, and Gmax denotes a maximum width of the space between the first string and the second string.

8. The solar cell module according to claim 7, wherein a relation of $W1 \leq Gmin+C1$ and $W2 \leq Gmin+C2$ is satisfied for each of the plurality of first solar cells and each of the plurality of second solar cells, where Gmin denotes a minimum width of the space between the first string and the second string.

9. The solar cell module according to claim 1, wherein the first light reflector and the second light reflector have different widths in an alignment direction of the first solar cell and the second solar cell.

10. The solar cell module according to claim 1, wherein the first light reflector and the second light reflector each have a tape-like shape that extends in a direction orthogonal to an alignment direction of the first solar cell and the second solar cell, a lengthwise edge portion of the first light reflector is bonded to the first solar cell, and a lengthwise edge portion of the second light reflector is bonded to the second solar cell.

11. The solar cell module according to claim 1, wherein the first light reflector and the second light reflector each include a resin base, and a reflective film on a first surface of the resin base, the first light reflector is disposed on the first solar cell using an adhesive that bonds a second surface of the resin base included in the first light reflector to the first solar cell, and the second light reflector is disposed on the second solar cell using an adhesive that bonds a back surface of the resin base included in the second light reflector to the second solar cell.

* * * * *